United States Patent [19]

Kojima et al.

[11] Patent Number: 4,587,197
[45] Date of Patent: May 6, 1986

[54] FLEXIBLE PHOTOSENSITIVE POLYMER COMPOSITION WITH AZIDE AND/OR AMINE COMPOUND, POLY(AMIC ACID) AND HIGHLY POLAR COMPOUND WITH BOILING POINT ABOVE 150° C.

[75] Inventors: Mithumasa Kojima, Hitachi; Fumio Kataoka; Fusaji Shoji, both of Yokohama; Hitoshi Yokono, Katsuta, all of Japan

[73] Assignees: Hitachi, Ltd.; Hitachi Chemical Co., Ltd., both of Tokyo, Japan

[21] Appl. No.: 578,058

[22] Filed: Feb. 8, 1984

[30] Foreign Application Priority Data

Mar. 4, 1983 [JP] Japan .................................. 58-34589

[51] Int. Cl.$^4$ .......................... G03C 1/71; G03C 1/60
[52] U.S. Cl. .................... 430/196; 430/194; 430/197; 430/167; 430/308; 430/325; 430/330; 430/919; 430/927
[58] Field of Search .............. 430/196, 197, 194, 308, 430/325, 167, 927, 919, 330

[56] References Cited

U.S. PATENT DOCUMENTS

| | | | |
|---|---|---|---|
| 2,990,281 | 6/1961 | Printy et al. | 430/176 |
| 4,107,391 | 8/1978 | Moore et al. | 428/412 |
| 4,148,654 | 4/1979 | Oddi | 430/192 |
| 4,216,019 | 8/1980 | Reed et al. | 430/308 |
| 4,254,197 | 3/1981 | Miura et al. | 430/196 |
| 4,268,601 | 5/1981 | Namiki et al. | 430/167 |
| 4,356,247 | 10/1982 | Aotani et al. | 430/196 |
| 4,451,551 | 5/1984 | Kataoka et al. | 430/919 |

Primary Examiner—Charles L. Bowers, Jr.
Attorney, Agent, or Firm—Antonelli, Terry & Wands

[57] ABSTRACT

A photosensitive polymer composition comprising (A) a poly(amic acid), (B) a compound or a mixture of compounds which can form a compound having two or more amino groups in the molecule, and (C) at least one compound having a boiling point of 150° C. or higher at atmospheric pressure and selected from the group consisting of

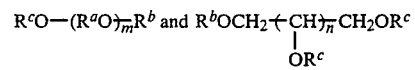

wherein $R^a$, $R^b$, $R^c$, m and n are as defined in the specification, has good properties and does not produce cracks on a pattern at the time of development obtained from said composition.

14 Claims, No Drawings

FLEXIBLE PHOTOSENSITIVE POLYMER COMPOSITION WITH AZIDE AND/OR AMINE COMPOUND, POLY(AMIC ACID) AND HIGHLY POLAR COMPOUND WITH BOILING POINT ABOVE 150° C.

BACKGROUND OF THE INVENTION

This invention relates to a photosensitive polymer composition which can form a polyimide of excellent heat resistance.

Thermosetting type polyimides have hitherto been used as interlayer insulating films or surface-protecting films for semiconductor elements, LSIs, etc. (U.S. Pat. No. 3,179,614, U.S. Pat. No. 3,179,634). It is because the thermosetting type polyimides have such characteristics as (i) they can be made into a film easily, (ii) they can be flattened easily and (iii) they have excellent heat resistance.

In recent years, there has been a request for further shortening and rationalization of the step of forming the above films of the thermosetting type polyimides without sacrificing their characteristics (i) to (iii).

In response to the request, there have been proposed photosensitive polymer compositions endowed with photosensitivity and using a poly(amic acid). Specifically, the following photosensitive polymer compositions (1) and (2) have been known.

(1) A photosensitive polymer composition comprising a poly(amic acid), an amine compound having a group having a hydrogen atom combined with a tertiary or secondary carbon or an unsaturated bond-containing amine compound, and a bisazide. (Japanese Patent Appln. Kokai (Laid-Open No. 168942/82).

(2) A photosensitive polymer composition comprising a poly(amic acid) and an amine compound having, in the molecule, an aromatic bisazido group or a sulfonylazido group (Japanese Patent Appln. Kokai (Laid-Open) No. 102926/82).

In actual formation of an interlayer insulating film or a surface protecting film for semiconductor elements, LSIs, etc. by the use of the above photosensitive polymer compositions (1) and (2), there is employed a process in which a varnish containing such a photosensitive polymer composition is coated and dried, a light is irradiated thereon through a photomask, a wet development is conducted and, lastly, the remaining solvent, amine and azide are evaporated.

However, in the pattern formation according to the above process by the use of the photosensitive polymer composition (1) or (2), there frequently occurred, at the time of development, cracking followed by pattern cutting. Although the cause has not yet been made clear, the tendency was more striking when the time of leaving the film to stand from drying to development was longer.

SUMMARY OF THE INVENTION

An object of the present invention is to provide a photosensitive polymer composition which does not cause cracking in patterns at the time of pattern development.

This invention provides a photosensitive polymer composition comprising
(A) a poly(amic acid),
(B) a compound or a mixture of compounds which can form a compound having two or more amino groups in the molecule by irradiation with light selected from (i) a mixture of at least one bisazide and at least one amine having at least one group of the formula: $>C=C<$ in the molecule and (ii) at least one amine compound having an aromatic-azido group or an aromatic sulfonylazido group in the molecule, and (C) at least one compound having a boiling point of 150° C. or higher under atmospheric pressure and selected from the group consisting of compounds of the formula:

$$R^c O (R^a O)_m R^b \quad [I]$$

wherein $R^a$ is $(CH_2)_2$, $(CH_2)_3$, $-CH-CH_2-$,
$\phantom{wherein R^a is (CH_2)_2, (CH_2)_3,}\phantom{xxxxxxx}|$
$\phantom{wherein R^a is (CH_2)_2, (CH_2)_3, -CH-CH_}CH_3$ $$-CH_2-CH-,\ (CH_2)_4,\ \text{or}\ -C-CH_2-;$$
with $CH_3$ groups $R^b$ and $R^c$ are independently hydrogen, a lower alkyl group or an acetyl group; and m is an integer of 1 to 10, and compounds of the formula:

$$R^b OCH_2(CH)_n CH_2 OR^c \quad [II]$$
$$\phantom{R^b OCH_2}|$$
$$\phantom{R^b OCH_2}OR^c$$

wherein $R^b$ and $R^c$ are as defined above.

DESCRIPTION OF THE PREFERRED EMBODIMENTS

Appearance of cracks in patterns at the time of development will be due to the fact that the pattern film has insufficient strength to withstand the sum of an external stress applied to the film and an internal stress generating within the film. The external stress applied to the film appears when the temperature of drying (50° to 100° C.) after coating is higher than the temperature of development (0° to 40° C.). It is presumed therefore that, at the time of development, the film having a larger thermal expansion coefficient contracts to a larger extent than the substrate and, as a result, is subjected to a tensile stress by the substrate. Meanwhile, the internal stress within the film is presumed to be generated due to a difference in degree of crosslinking by light between the upper portion and the lower portion of the coating film. Accordingly, the internal stress is larger when the film is thicker. Appearance of cracks in patterns at the time of development will be due to that both of the above defined external and internal stresses are concentrated at the end surfaces of patterns.

Based on the above inference, the present inventors judged that appearance of cracks in patterns at the time of development can be avoided by allowing the film to have flexibility to reduce the above mentioned stress.

In order for the film to have flexibility, photosensitive polymer compositions are required to contain an organic compound with high polarity, having a boiling point of 150° C. or higher under atmospheric pressure and not reacting, during storage or at the drying process to form films, with any other component of the photosensitive polymer composition.

More concretely, the photosensitive polymer composition of this invention comprises
(A) 100 parts by weight of a poly(amic acid),
(B)-(1) 0.1 to 100 parts by weight of a bisazide, (B)-(2) 1 to 400 parts by weight of an amine having at least one group of the formula >C=C< in the molecule, and (C) 1 to 50 parts by weight of at least one compound having a boiling point of 150° C. or higher at atmospheric pressure and selected from the group consisting of compounds of the formula:

$$R^cO + R^aO)_m R^b \quad [I]$$

wherein $R^a$ is $+CH_2)_2$, $+CH_2)_3$, $-CH-CH_2-$,
$\qquad\qquad\qquad\qquad\qquad\qquad\qquad\quad |$
$\qquad\qquad\qquad\qquad\qquad\qquad\qquad\ \ CH_3$ $\qquad\qquad\qquad\qquad\qquad\qquad\qquad\qquad\quad CH_3$
$\qquad\qquad\qquad\qquad\qquad\qquad\qquad\qquad\quad |$
$-CH_2-CH-$, $+CH_2)_4$, or $-C-CH_2-$;
$\qquad\ \ \ \ |\qquad\qquad\qquad\qquad\qquad\ \ \ |$
$\qquad\ \ CH_3\qquad\qquad\qquad\qquad\qquad CH_3$ $R^b$ and $R^c$ are independently hydrogen, a lower alkyl group or an acetyl group; and m is an integer of 1 to 10, and compounds of the formula:

$$R^bOCH_2+CH)_n CH_2OR^c \quad [II]$$
$$\qquad\qquad\quad |$$
$$\qquad\qquad OR^c$$

wherein $R^b$ and $R^c$ are as defined above; and n is an integer of 1 to 5, or (A) 100 parts by weight of a poly(amic acid), (B') 1 to 100 parts by weight of at least one amine compound having an aromatic azido group or an aromatic sulfonylazido group in the molecule, and (C) 1 to 50 parts by weight of at least one compound having a boiling point of 150° C. or higher at atmospheric pressure and selected from the group consisting of compounds of the formula:

$$R^cO-(R^aO)_m R^b \quad [I]$$

wherein $R^a$ is $+CH_2)_2$, $+CH_2)_3$, $-CH-CH_2-$,
$\qquad\qquad\qquad\qquad\qquad\qquad\qquad\quad |$
$\qquad\qquad\qquad\qquad\qquad\qquad\qquad\ \ CH_3$ $\qquad\qquad\qquad\qquad\qquad\qquad\qquad\qquad\quad CH_3$
$\qquad\qquad\qquad\qquad\qquad\qquad\qquad\qquad\quad |$
$-CH_2-CH-$, $+CH_2)_4$, or $-CH-CH_2-$;
$\qquad\ \ \ \ |\qquad\qquad\qquad\qquad\qquad\ \ \ |$
$\qquad\ \ CH_3\qquad\qquad\qquad\qquad\qquad CH_3$ $R^b$ and $R^c$ are independently hydrogen, a lower alkyl group or an acetyl group; and m is an integer of 1 to 10, and compounds of the formula:

$$R^bOCH_2+CH)_n CH_2OR^c \quad [II]$$
$$\qquad\qquad\quad |$$
$$\qquad\qquad OR^c$$

wherein $R^b$ and $R^c$ are as defined above; and n is an integer of 1 to 5.

As the component (C), i.e. the organic compound with high polarity, having a boiling point of 150° C. or higher under atmospheric pressure and not reacting, during storage or at the drying process to form films, with any other component of the photosensitive polymer composition, there can be used at least one compound selected from the compounds represented by the following formulas [I] and [II]:

$$R^cO+R^aO)_m R^b \quad [I]$$

$$R^bOCH_2+CH)_n CH_2OR^c \quad [II]$$
$$\qquad\qquad\quad |$$
$$\qquad\qquad OR^c$$

wherein $R^a$, $R^b$, $R^c$, m and n are as defined above. In the formulas [I] and [II], the lower alkyl group preferably has 1 to 5 carbon atoms.

Examples of the component (C) are ethylene glycol, diethylene glycol, triethylene glycol, tetraethylene glycol, polyethylene glycol (n is 5 to 10 in the above general formula [I]), propylene glycol, dipropylene glycol, tripropylene glycol, glycerine, triethylene glycol monomethyl ether, triethylene glycol monoethyl ether, triethylene glycol dimethyl ether, tetraethylene glycol dimethyl ether, etc. Those compounds can be used singly or in combination of two or more of them. It is preferable to use triethylene glycol (in the general formula [I], $R^a$ is $(CH_2)_2$, m is 3 and $R^b$ and $R^c$ are hydrogen), tetraethylene glycol (in the general formula [I], $R^a$ is $-CH_2-_2$, m is 4 and $R^b$ and $R^c$ are hydrogen), glycerine (in the general formula [II], $R^b$ and $R^c$ are hydrogen and n is 1) or a mixture thereof, and more preferable to use tetraethylene glycol dimethyl ether (in the general formula [I], $R^a$ is $(CH_2)_2$, m is 4, and $R^b$ and $R^c$ are methyl).

Any component (C) having a boiling point lower than 150° C. under atmospheric pressure cannot be used because it vaporizes by drying and heating during film formation.

The component (C) is used in an amount of 1 to 50 parts by weight, preferably 10 to 40 parts by weight per 100 parts by weight of the poly(amic acid). When the component (C) is used in an amount more than 50 parts by weight or less than 1 part by weight, a wet development can not be performed satisfactorily.

As the poly(amic acid) (A), there can be used those conventionally used such as those having a repeating unit of the formula:

$$\left(\begin{array}{c} \overset{O}{\underset{\|}{C}}-R^1-\overset{O}{\underset{\|}{C}}-NH-R^2-NH \\ (COOH)_n \end{array}\right) \quad [III]$$

wherein $R^1$ is a tri- or tetravalent organic group; $R^2$ is a divalent organic group; and n is 1 or 2.

In the formula [III], it is preferable that $R^1$ and $R^2$ are individually aromatic ring-containing or heterocyclic ring-containing organic groups from the standpoint of heat resistance when a polyimide is formed.

Examples of $R^1$ include

[structural formulas of aromatic groups]

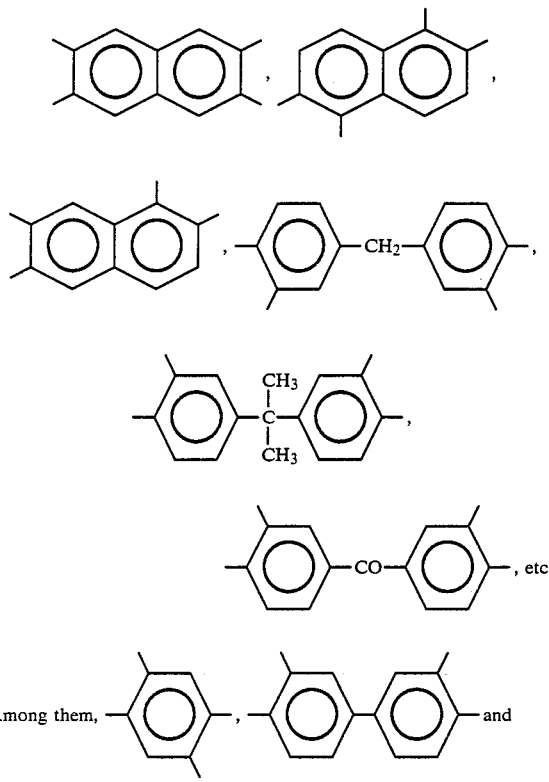

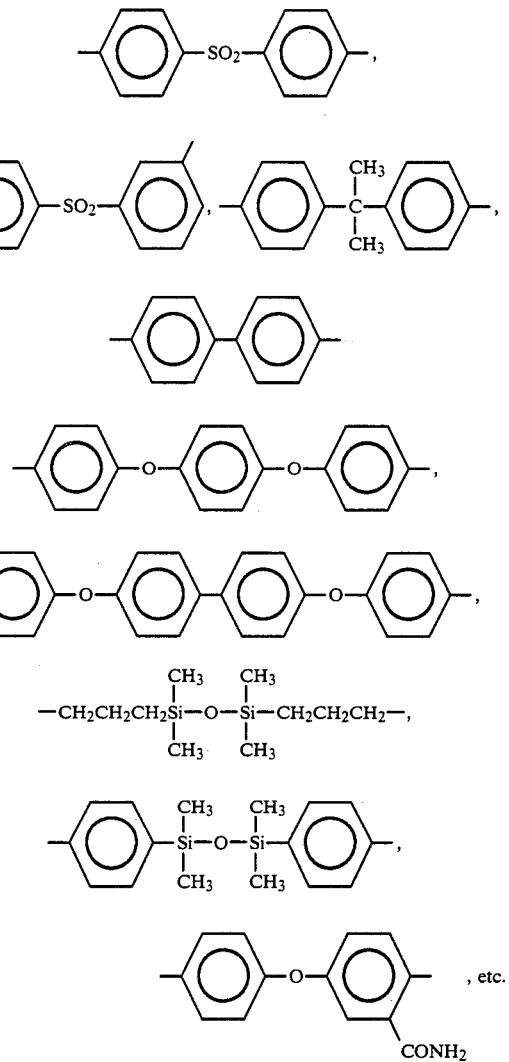

are preferable.

In the above formulas of $R^1$, the connecting bonds represent those with the carbonyl groups of the polymer main chain and the carboxyl are at ortho positions relative to the connecting bonds.

Examples of $R^2$ include

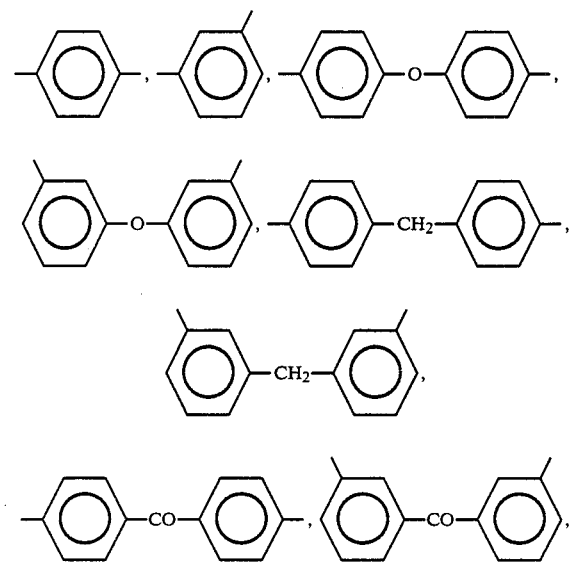

are preferable.

Polymers having, as the major component, the repeating unit represented by the formula [III] may be homopolymers of poly(amic acid)s having the repeating unit of the formula [III] or copolymers having repeating unit of the formula [III] and other repeating units. Examples of these polymers are a polyester-amic acid, a polyhydrazide-amic acid, etc.

These polymers may have substituents such as amino groups, amido groups, carboxyl groups or sulfonic groups as long as the substituents do not give bad effects on the heat resistance of the polyimide formed.

As the bisazide compound, there can be used those conventionally used and represented by the formula:

$$N_3-R^3-N_3 \qquad [IV]$$

wherein $R^3$ is a bivalent or trivalent organic groups.
Examples of the bisazide compound include

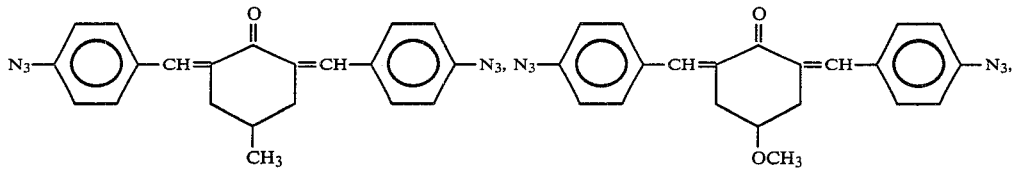

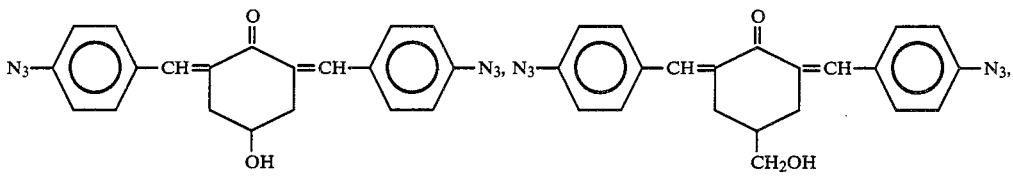

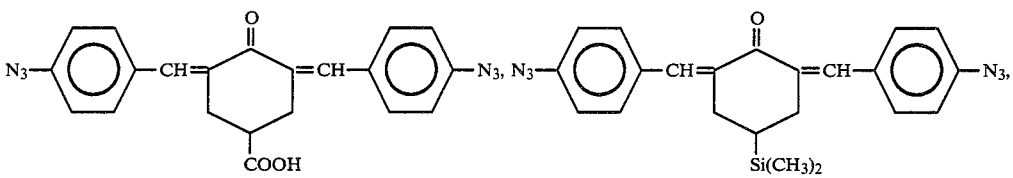

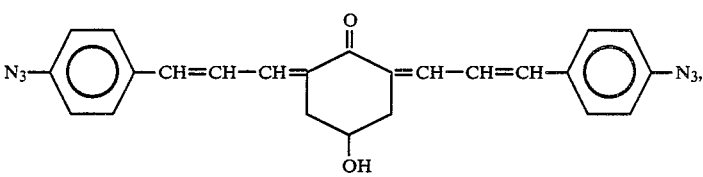

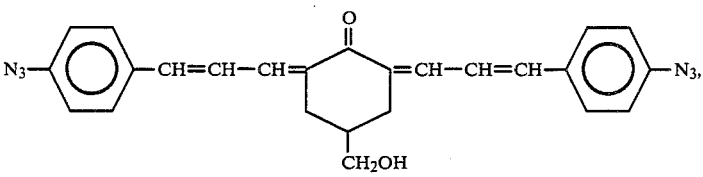

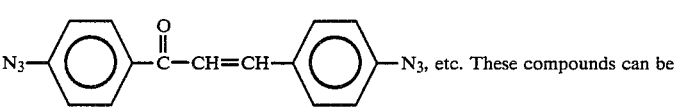

, etc. These compounds can be used alone or as a mixture thereof. Preferable ones among them are

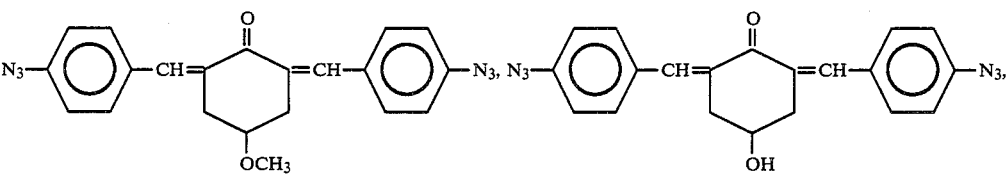

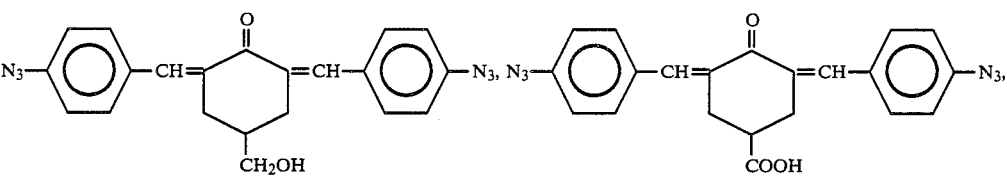

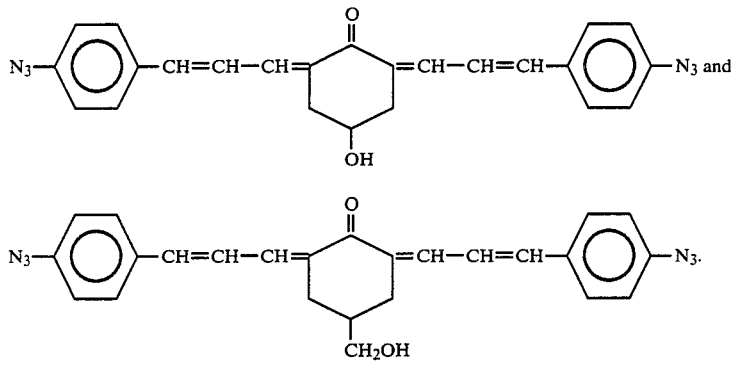

The bisazide compound represented by the formula [IV] is used in an amount of 0.1 to 100 parts by weight per 100 parts by weight of the component (A) having the repeating unit represented by the formula [III]. It is preferable to use the bisazide compound in an amount of 0.5 to 50 parts by weight. When it is used in an amount of less than 0.1 part by weight or more than 100 parts by weight, the wet development after light exposure becomes difficult and the heat resistance of the polyimide formed is reduced.

As the amine which is used together with the bisazide compound, there can be used those conventionally used and represented by the formula:

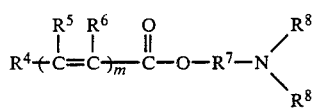 [V]

wherein $R^4$, $R^5$, $R^6$ and $R^8$ are independently hydrogen or at least one group selected from a lower alkyl group preferably having 1 to 5 carbon atoms, a phenyl group and a vinyl group; $R^7$ is an alkylene group; and m is an integer of 1 or more, preferably 1 to 5.

Examples of the amine include

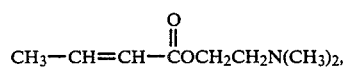

-continued $$CH_3-CH=CH-CH=CH-\overset{O}{\overset{\|}{C}}OCH_2CH_2CH_2N(CH_3)_2,$$

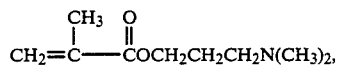

, etc.

These compounds can be used alone or as a mixture thereof. Preferable ones among them are

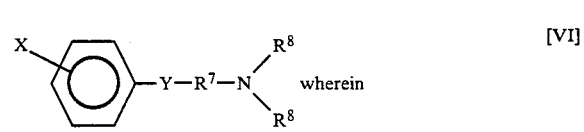 and $$CH_3-CH=CH-CH=CH-\overset{O}{\overset{\|}{C}}OCH_2CH_2CH_2N(CH_3)_2.$$

These compounds react with the bisazide represented by the formula [IV] with high efficienty.

The amine represented by the formula [V] is used in an amount of 1 to 400 parts by weight per 100 parts by weight of the component (A) having the repeating unit represented by the formula [III]. It is preferable to use the amine compound in an amount of 10 to 400 parts by weight. When it is used in an amount of less than 1 part by weight or more than 400 parts by weight, the resulting film has lower sensitivity and its developability worsens.

As the amine compound (B') having an aromatic azido group or a sulfonylazido group and being used in place of the bisazide compound and the amine, there can be used compounds conventionally used, for example, those represented by the formula:

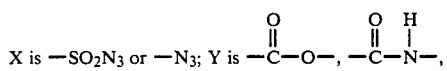 [VI]

wherein

X is $-SO_2N_3$ or $-N_3$; Y is $-\overset{O}{\overset{\|}{C}}-O-$, $-\overset{O}{\overset{\|}{C}}-\overset{H}{\overset{|}{N}}-$, -continued
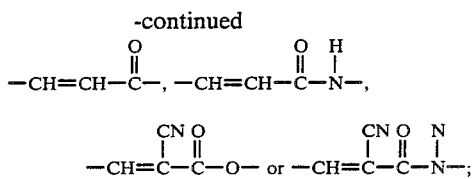
X and Y each are at a m- or p-position; and $R^7$ and $R^8$ are as defined above.
Examples of the amine compound (B′) are
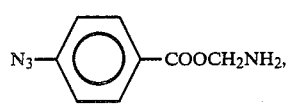
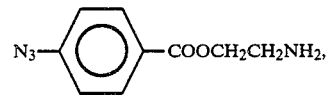
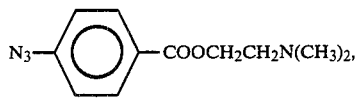
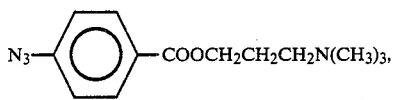
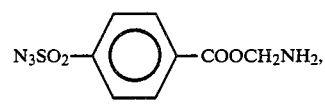
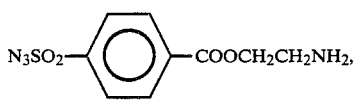
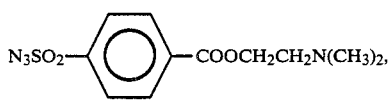
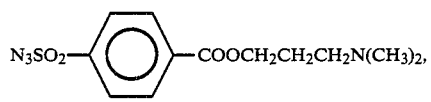
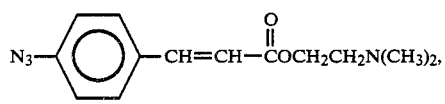
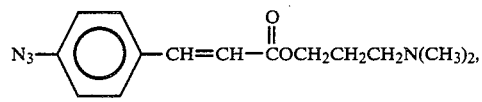
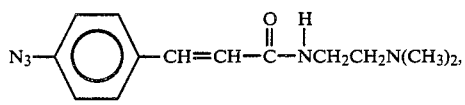
-continued
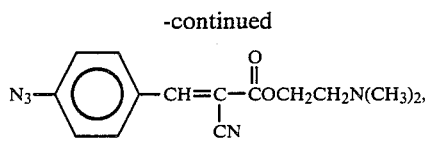
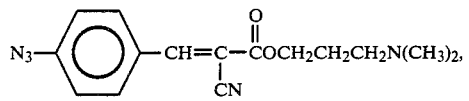
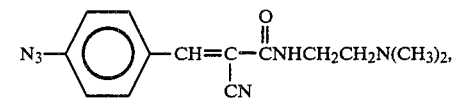
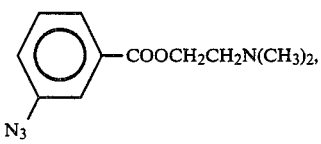
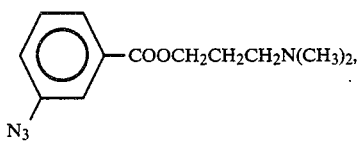
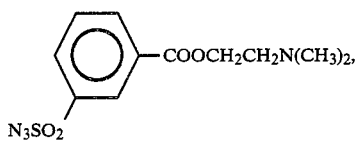
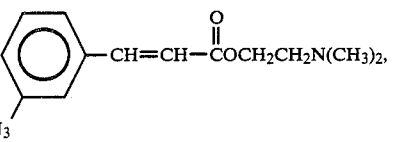
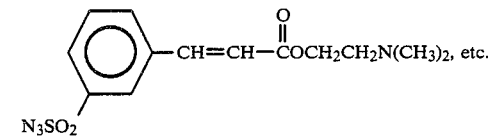
These compounds can be used alone or as a mixture thereof. Preferable ones among them are
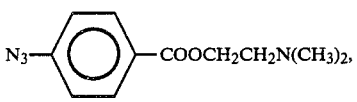
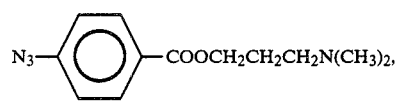
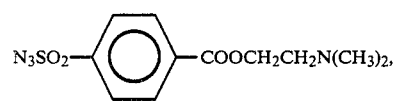

-continued

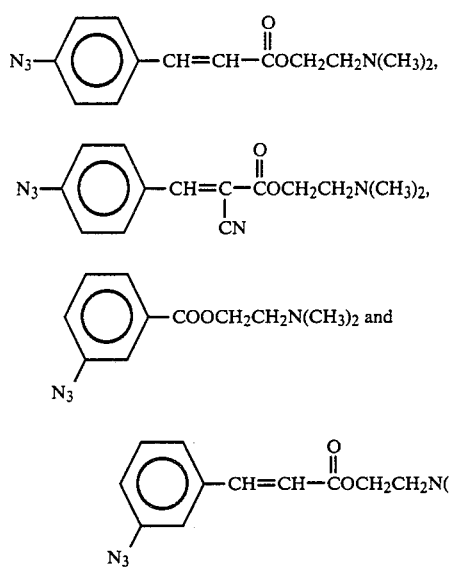

The amine compound represented by the formula [VI] is used in an amount of 1 to 100 parts by weight per 100 parts by weight of the component (A) having the repeating unit represented by the formula [III]. It is preferable to use the amine compound in an amount of 10 to 100 parts by weight. When it is used in an amount less than 1 part by weight or more than 100 parts by weight, the developability and quality of the film are affected badly.

The photosensitive polymer composition of the present invention can be applied as a varnish wherein the composition is dissolved in an organic solvent. As the solvent, non-protonic polar solvents are suitable from the standpoint of solvency. Examples of such solvents are N-methyl-2-pyrrolidone, N-acetyl-2-pyrrolidone, N-benzyl-2-pyrrolidone, N,N-dimethylformamide, N,N-dimethylacetamide, dimethyl sulfoxide, hexamethylphosphortriamide, N-acetyl-ε-caprolactam, dimethylimidazolidinone, etc. These solvents can be used alone or as a mixture there of. Preferable ones among them are N-methyl-2-pyrrolidone and N,N-dimethylacetamide.

A sensitizer can be used in the photosensitive polymer composition of the present invention in order to further enhance the sensitivity of the composition. The sensitizer can be used in an amount of 20% by weight or less based on the weight of the component (a) having the repeating unit represented by the formula [III]. The use of the sensitizer in a larger amount badly affects the developability of the film and the characteristics of the cured film.

Examples of the sensitizer are anthraquinone, 2-methylanthraquinone, 2-ethylanthraquinone, benzoquinone, 1,2-naphthoquinone, 1,4-naphthoquinone, benzophenone, P,P′-dimethylbenzophenone, Michler's ketone, 2-nitrofluorene, 5-nitroacenaphthene, anthrone, benzoin isopropyl ether, 4,4′-bis(diethylamino)benzophenone, dibenzalacetone, etc.

As the substrate on which the photosensitive polymer composition of the present invention is coated in the form of a varnish, there can be used a metal, glass, a semiconductor, a metal oxide insulator (for example, $TiO_2$, $Ta_2O_8$, $SiO_2$, etc.), silicon nitride and so forth.

A varnish containing the photosensitive polymer composition of the present invention is coated on the above mentioned substrate and dried to obtain a coating film. Thereafter, a fine pattern is formed on the film by a fine pattern-forming technique conventionally used in lithography.

Coating of the varnish containing the photosensitive polymer composition of the present invention on the substrate can be conducted by a spin coating using a spinner, dipping, spraying, printing, etc. The thickness of the film obtained can be controlled by the coating method, the solid content in the varnish containing the present photosensitive polymer composition, the viscosity of the varnish, etc.

The coated film formed on the substrate is exposed to irradiation by ultraviolet light. Then, the unexposed portions of the film are dissolved by a developing solution and removed to obtain a relief pattern.

As the light source, there can be used ultraviolet light, a visible light and a radiation.

As the developing solution, there can be used an aprotic polar solvent such as N-methyl-2-pyrrolidone, N-acetyl-2-pyrrolidone, N,N-dimethylformamide, N,N-dimethylacetamide, dimethyl sulfoxide, hexamethylphosphortriamide, dimethylimidazolidinone, N-benzyl-2-pyrrolidone, N-acetyl-ε-caprolactam or the like, or its mixture with a non-solvent for poly(amic acid)s such as methanol, ethanol, isopropyl alcohol, benzene, toluene, xylene, methyl Cellosolve, water or the like.

The relief pattern formed by development is then washed with a rinse to remove the developing solution.

As the rinse, it is preferable to use a nonsolvent for poly(amic acid)s which solvent has good miscibility with the developing solution. Examples of the rinse are methanol, ethanol, isopropyl alcohol, benzene, toluene, xylene, methyl Cellosolve, water, etc. Preferable ones among them are methanol, ethanol, isopropyl alcohol and water.

The relief pattern obtained by the above treatment is made from a precursor of polyimide. By a heat treatment at a temperature ranging from 150° C. to 450° C., it is converted to a relief pattern made from a heat-resistant polyimide having imido rings and other cylic groups.

The thus obtained heat-resistant polymer can be used as a passivation film for semiconductors, an interlayer insulating film for multi-layered integrated circuits, a solder-resistant film for printed circuits, an orientation film for liquid crystal displays, etc. It can also be used as a dry-etching-resistant photoresist.

The present invention will be explained in detail hereinunder by way of Examples.

EXAMPLE 1

An amine solution was prepared by dissolving 100 g (0.5 mole) of 4,4′-diaminodiphenyl ether in 1791 g of N-methyl-2-pyrrolidone under a nitrogen stream. While maintaining this solution at about 15° C. with ice-cooling with stirring, 109 g (0.5 mole) of pyromellitic dianhydride was added thereto. After completion of the addition, the reaction was continued further for 5 hours at about 15° C. to obtain a solution of a poly(amic acid) having a repeating unit of the formula [VII] and having a viscosity of 50 poises at 30° C.

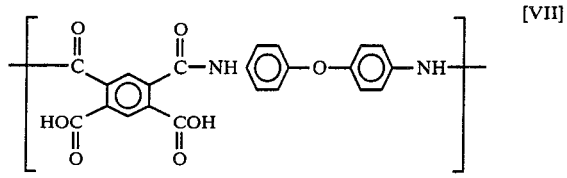

In 20 g of the solution of the poly(amic acid) having the repeating unit of the formula [VII] obtained above were dissolved 1.57 g (0.01 mole) of 2-(N,N-dimethylamino)ethyl methacrylate, 0.37 g (0.001 mole) of 2,6-bis(p-azidobenzal)-4-hydroxycyclohexanone and 0.4 g of triethylene glycol. Then, the resulting solution was pressure-filtered through a filter having openings of 1 μm.

The solution obtained (filtrate) was spin coated on a silicon wafer by the use of a spinner and then dried for 30 minutes at 70° C. to obtain a coating film having a thickness of 1.5 μm. This film was covered with a soda-lime glass photomask having a striped pattern so that the film and the photomask had a tight contact and then ultraviolet light was irradiated thereon for 30 seconds by the use of an Xe—Hg lamp of 500 W. The intensity of the ultraviolet light at the film surface was 2 mW/cm$^2$ at a wavelength of 365 nm. After the irradiation, development was conducted by the use of a mixed solvent consisting of 4 volumes of N-methyl-2-pyrrolidone and 1 volume of water. Then, washing was made with a rinse (ethanol) to obtain a relief pattern having a minimum line width of 3 μm.

The pattern obtained showed no blurring even after heating for 60 minutes at 400° C. Further, microcracks were not observed in the pattern after the development either immediately after or three days after the formation of the coating film.

EXAMPLE 2

In 20 g of the solution of the poly(amic acid) having the repeating unit of the formula [VIII] obtained in Example 1 were dissolved 1.7 g (0.01 mole) of 3-(N,N-dimethylamino)propyl methacrylate, 0.32 g (0.0008 mole) of 2,6-bis(p-azidobenzal)-4-carboxycyclohexanone and 0.4 g of triethylene glycol. The resulting solution was pressure-filtered through a filter having openings of 1 μm.

The solution obtained (filtrate) was spin coated on a silicon wafer by the use of a spinner and then dried for 30 min at 70° C. to obtain a coating film having a thickness of 4 μm. This film was covered with a soda-lime glass photomask having a striped pattern so that the film and the photomask had a tight contact and then ultraviolet light was irradiated thereon for 30 seconds by the use of a high pressure mercury lamp. After the irradiation, development was conducted by the use of a mixed solution consisting of 4 volumes of N-methyl-2-pyrrolidone and 1 volume of water. Then, washing was made with ethanol to obtain a relief pattern having a minimum line width of 7 μm.

The pattern obtained showed no blurring even after heating for 60 minutes at 400° C. Further, microcracks were not observed in the pattern after the development either immediately after or three days after the formation of the coating film.

EXAMPLE 3

In 20 g of the solution of the poly(amic acid) having the repeating unit of the formula [VII] obtained in Example 1 were dissolved 1.7 g (0.01 mole) of 3-(N,N-dimethylamino)propyl methacrylate, 0.38 g (0.001 mole) of 2,6-bis(p-azidobenzal)-4-methoxycyclohexanone and 0.5 g of tetraethylene glycol. The resulting solution was pressure-filtered through a filter having openings of 1 μm.

The solution obtained (filtrate) was spin coated on a silicon wafer by the use of a spinner and then dried for 30 minutes at 70° C. to obtain a coating film having a thickness of 4.2 μm. This film was covered with a soda-lime glass photomask having a striped pattern so that the film and the photomask had a tight contact and then ultraviolet light was irradiated thereon for 30 seconds by the use of a high pressure mercury lamp. After the irradiation, development was conducted by the use of a mixed solution consisting of 4 volumes of N-methyl-2-pyrrolidone and 1 volume of water. Then, washing was made with ethanol to obtain a relief pattern having a minimum line width of 7 μm.

The pattern obtained showed no blurring even after heating for 60 minutes at 400° C. Further, microcracks were not observed in the pattern after the development either immediately after or three days after the formation of the coating film.

EXAMPLE 4

An amine solution was prepared by dissolving 90 g (0.45 mole) of 4,4'-diaminodiphenyl ether and 12.1 g (0.05 mole) of 4,4'-diaminodiphenyl ether-3-carbonamide in 1,764 g of N-methyl-2-pyrrolidone under a nitrogen stream. While maintaining this solution at about 15° C. with ice-cooling and stirring, 54.5 g (0.25 mole) of pyrromellific dianhydride and 80.5 g (0.25 mole) of 3,3', 4,4'-benzophenone tetracarboxylic dianhydride were added thereto. After the addition, the reaction was continued for further 5 hours at about 15° C. to obtain a solution of a poly(amic acid) having a repeating unit of the formula [VIII] and having a viscosity of 50 poises at 30° C.:

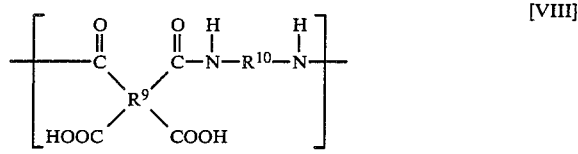

wherein $R^9$ is either 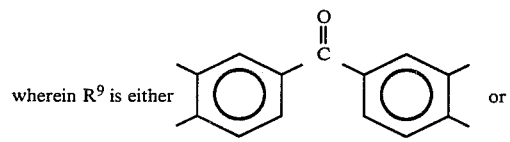 or in a ratio of 1:1; and $R^{10}$ is either 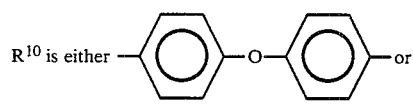 or

17

-continued

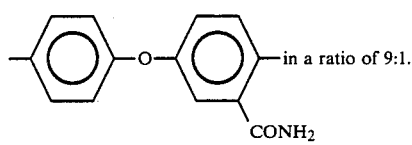
in a ratio of 9:1.

In 20 g of the solution of the poly(amic acid) obtained above were dissolved 1.7 g (0.01 mole) of 3-(N,N-dimethylamino)propyl methacrylate, 0.37 g (0.001 mole) of 2,6-bis(p-azidobenzal)-4-hydroxycyclohexanone and 0.5 g of glycerine. The resulting solution was pressure-filtered through a filter having openings of 1 μm.

The solution obtained (filtrate) was spin coated on a silicon wafer by the use of a spinner and then dried for 30 minutes at 70° C. to obtain a coating film having a thickness of 4 μm. This film was covered with a soda-lime glass photomask having a striped pattern so that the film and the photomask had a tight contact and then ultraviolet light was irradiated thereon for 30 seconds by the use of a high pressure mercury lamp. After the irradiation, development was conducted by the use of a mixed solution consisting of 4 volumes of N-methyl-2-pyrrolidone and 1 volume of water. Then, washing was made with ethanol to obtain a relief pattern having a minimum line width of 7 μm.

The pattern obtained showed no blurring even after heating for 60 minutes at 400° C. Further, microcracks were not observed in the pattern after the development either immediately after or three days after the formation of the coating film.

EXAMPLE 5

In 20 g of the solution of the poly(amic acid) having the repeating unit of the formula [VIII] obtained in Example 4 were dissolved 1.7 g (0.01 mole) of 3-(N,N-dimethylamino)propyl methacrylate, 0.32 g (0.0008 mole) of 2,6-bis(p-azidobenzal)-4-carboxycyclohexanone and 0.5 g of tetraethylene glycol. The resulting solution was pressure-filtered through a filter having openings of 1 μm. The solution obtained (filtrate) was spin coated on a silicon wafer by the use of a spinner and then dried for 30 minutes at 70° C. to obtain a coating film having a thickness of 2 μm. This film was covered with a soda-lime glass photomask having a striped pattern so that the film and the photomask had a tight contact and then ultraviolet light was irradiated thereon for 30 seconds by the use of a high pressure mercury lamp. After the irradiation, development was conducted by the use of a mixed solution consisting of 4 volumes of N-methyl-2-pyrrolidone and 1 volume of water. Then, washing was made with ethanol to obtain a relief pattern having a minimum line width of 4 μm.

The pattern obtained showed no blurring even after heating for 60 minutes at 400° C. Further, microcracks were not observed in the pattern after the development either immediately after or three days after the formation of the coating film.

EXAMPLE 6

An amine solution was prepared by dissolving 100 g (0.5 mole) of 4,4'-diaminodiphenyl ether in 2,105 g of N-methyl-2-pyrrolidone under a nitrogen stream. While maintaining this solution at about 15° C. with ice-cooling and stirring, 147 g (0.5 mole) of 3,3',4,4'-biphenyl tetracarboxylic dianhydride was added thereto. After the addition, the reaction was continued for further 5 hours at about 15° C. to obtain a solution of a poly(amic acid) having a repeating unit of the formula [IX] and having a viscosity of 70 poises at 30° C.

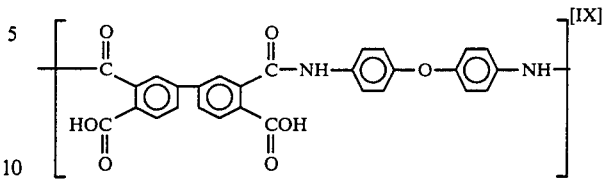

In 20 g of the solution of the poly(amic acid) obtained above were dissolved 1.5 g (0.009 mole) of 3-(N,N-dimethylamino)propyl methacrylate, 0.28 g (0.0007 mole) of 2,6-bis(p-azidobenzal)-4-carboxycyclohexanone and 0.5 g of tetraethylene glycol. The resulting solution was pressure-filtered through a filter having openings of 1 μm.

The solution obtained (filtrate) was spin coated on a silicon wafer by the use of a spinner and then dried for 30 minutes at 70° C. to obtain a coating film having a thickness of 2 μm. This film was covered with a soda-lime glass photomask having a striped pattern so that the film and the photomask had a tight contact and then ultraviolet light was irradiated thereon for 30 seconds by the use of an Xe—Hg lamp of 500 W. Then, the development was conducted by the use of a mixed solution consisting of 5 volumes of N-methyl-2-pyrrolidone and 1 volume of water. Then, washing was made with a rinse (ethanol) to obtain a a relief pattern having a minimum line width of 3 μm.

The pattern obtained showed no blurring even after heating for 60 minutes at 400° C. Further, microcracks were not observed in the pattern after the development either immediately after or three days after the formation of the coating film.

EXAMPLE 7

In 20 g of the solution of the poly(amic acid) having the repeating unit of the formula [VII] obtained in Example 1 were dissolved 2.34 g (0.01 mole) of 2-(N,N-dimethylamino)ethyl p-azidobenzoate and 0.4 g of triethylene glycol. The resulting solution was pressure-filtered through a filter having openings of 1 μm. The solution obtained (filtrate) was spin coated on a silicon wafer by the use of a spinner and then dried for 30 minutes at 90° C. to obtain a coating film having a thickness of 1.5 μm. This film was covered with a photomask having a striped pattern so that the film and the photomask had a tight contact and then ultraviolet light was irradiated thereon for 30 seconds by the use of an Xe—Hg lamp of 500 W. After the irradiation, the development was conducted by the use of a mixed solution consisting of 4 volumes of N-methyl-2-pyrrolidone and 1 volume of water. Then, washing was made with a rinse (ethanol) to obtain a relief pattern having a minimum line width of 3 μm.

The pattern obtained showed no blurring even after heating for 60 minutes at 400° C. Further, microcracks were not observed in the pattern after the development either immediately after or three days after the formation of the coating film.

EXAMPLE 8

In 20 g of the solution of the polymer having the repeating unit of the formula [VIII] obtained in Example 1 were dissolved 2.6 g (0.01 mole) of 2-(N,N-dimethylamino)ethyl p-azidocinnamate and 0.4 g of tetraethylene glycol. The resulting solution was pressure-filtered through a filter having openings of 1 μm. The solution obtained (filtrate) was spin coated on a silicon wafer by the use of a spinner and then dried for 30 minutes at 80° C. to obtain a coating film having a thickness of 2 μm. This film was covered with a photomask having a striped pattern so that the film and the photomask had a tight contact and then ultraviolet light was irradiated thereon by the use of an Xe—Hg lamp of 500 W. After the irradiation, the development was made with a mixed solution consisting of 4 volumes of N-methyl-2-pyrrolidone and 1 volume of water. Then, washing was made with a rinse (ethanol) to obtain a relief pattern having a minimum line width of 3 μm.

The pattern obtained showed no blurring even after heating for 60 minutes at 400° C. Further, microcracks were not observed in the pattern after the development either immediately after or three days after the formation of the coating film.

COMPARATIVE EXAMPLES

For comparison with Examples 1 to 8, the same evaluation tests were conducted for compositions which were the same as those employed in Examples 1 to 8 except that triethylene glycol, tetraethylene glycol and glycerine were not added. There were produced cracks partially on patterns during the development step when samples were allowed to stand for one day after the formation of coating films. When the samples were allowed to stand for 3 days after the formation of coating films, there was a tendency to increase the generation of cracks on the patterns.

EXAMPLE 9

In 20 g of the solution of poly(amic acid) having the repeating unit of the formula [VII] obtained in Example 1 were dissolved 1.7 g (0.01 mole) of 3-(N,N-dimethylamino)propylmethyl methacrylate, 0.32 g (0.0008 mole) of 2,6-bis(p-azidobenzal)-4-carboxylcyclohexanone and 0.4 g of tetraethylene glycol dimethyl ether. The resulting solution was pressure-filtered through a filter having openings of 1 μm.

The solution obtained (filtrate) was spin coated on a silicon wafer by the use of a spinner and then dried for 20 minutes at 85° C. to obtain a coating film having a thickness of 6 μm. This film was covered with a soda-lime glass photomask having a striped pattern so that the film and the photomask had a tight contact and then ultraviolet light was irradiated thereon for 30 seconds by the use of a high pressure mercury lamp. After the irradiation, development was conducted by the use of a mixed solution consisting of 4 volumes of N-methyl-2-pyrrolidone and 1 volume of water. Then, rinsing was made with ethanol to obtain a relief pattern having a minimum line width of 7 μm.

The pattern obtained showed no blurring even after heating for 60 minutes at 400° C. Further, microcracks were not observed in the pattern after the development either immediately after or three days after the formation of the coating film.

What is claimed is:

1. A photosensitive polymer composition comprising an admixture of:
   (A) 100 parts by weight of a poly(amic acid),
   (B) a compound or a mixture of compounds which is photosensitive and which can form a compound having two or more amino groups by irradiation with light selected from the group consisting of (i) a mixture of at least one bisazide in an amount of 0.1 to 100 parts by weight and at least one amine having at least one group of the formula: $>C=C<$ in an amount of 1 to 400 parts by weight and (ii) 1 to 100 parts by weight of at least one amine compound having an aromatic azido group or an aromatic sulfonylazido group, and
   (C) 1 to 50 parts by weight of at least one compound with high polarity, having a boiling point of 150° C. or higher under atmospheric pressure and not reacting with any other component of the composition, and being selected from the group consisting of compounds of the formula:

(I)

wherein $R^a$ is 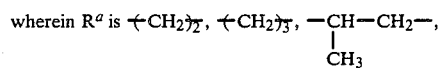

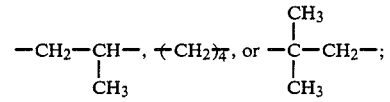

$R^b$ and $R^c$ are independently hydrogen, a lower alkyl group or an acetyl group; and m is an integer of 1 to 10, and compounds of the formula:

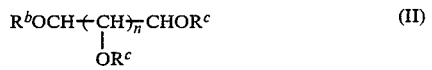

(II)

wherein $R^b$ and $R^c$ are as defined above.

2. A composition according to claim 1, wherein the component (B) is a mixture of at least one bisazide in an amount of 0.1 to 100 parts by weight and at least one amine having at least one group of the formula: $>C=C<$ in an amount of 1 to 400 parts by weight.

3. A composition according to claim 1, wherein the component (C) is at least one compound selected from the group consisting of triethylene glycol

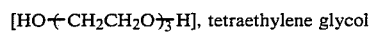, tetraethylene glycol

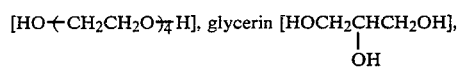

and tetraethylene glycol dimethyl ether $[CH_3O—(CH_2CH_2O)_4—CH_3]$.

4. A composition according to claim 1, wherein the poly(amic acid) has a repeating unit of the formula:

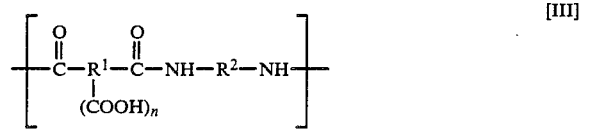

[III]

wherein $R^1$ is 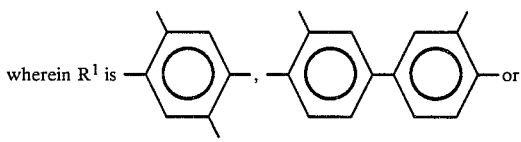

-continued

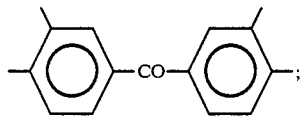

$R^2$ is 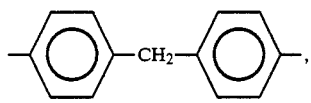

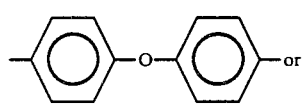

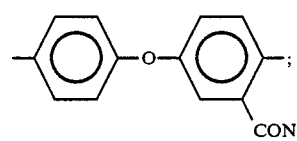

and n is an integer of 1 or 2.

5. A composition according to claim 1, wherein the bisazide is at least one compound selected from the group consisting of

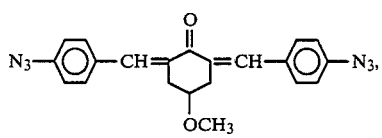

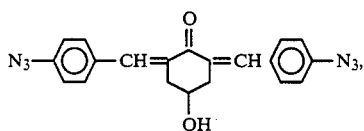

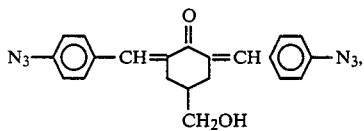

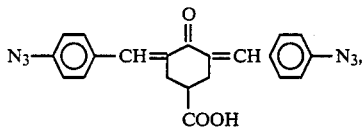

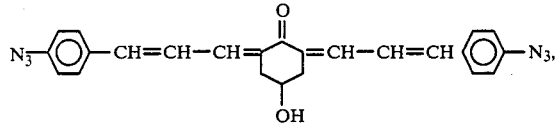

and

-continued

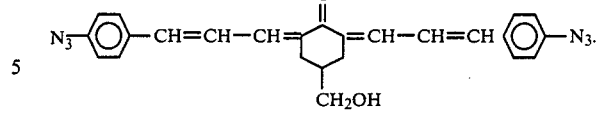

6. A composition according to claim 1, wherein the amine is at least one member selected from the group consisting of

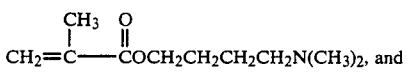

and

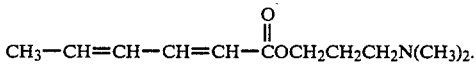

7. A composition according to claim 1, wherein the component (B) is at least one amine compound having an aromatic azido group or an aromatic sulfonylazido group in an amount of 1 to 100 parts by weight.

8. A composition according to claim 7, wherein the component (C) is at least one compound selected from the group consisting of triethylene glycol

[HO$\leftarrow$CH$_2$CH$_2$O$\rightarrow_3$H], tetraethylene glycol

[HO$\leftarrow$CH$_2$CH$_2$O$\rightarrow_4$H], glycerin [HOCH$_2$CHCH$_2$OH].
$\qquad\qquad\qquad\qquad\qquad\qquad\qquad\quad$ |
$\qquad\qquad\qquad\qquad\qquad\qquad\qquad\quad$ OH and tetraethylene glycol dimethyl ether
[CH$_3$O—(CH$_2$CH$_2$O)$_4$—CH$_3$].

9. A composition according to claim 7, wherein the poly(amic acid) has a repeating unit of the formula:

[III]

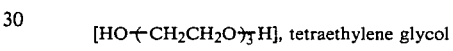

wherein $R^1$ is 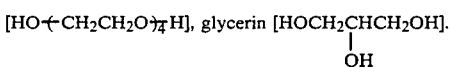

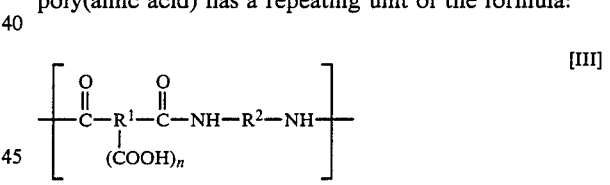

$R^2$ is 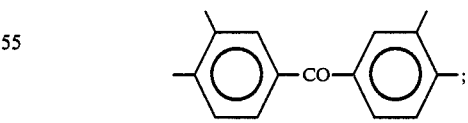

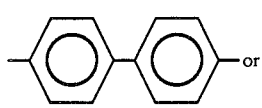 or

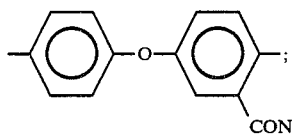;

and n is an integer of 1 or 2.

10. A composition according to claim 7, wherein the amine compound is at least one member selected from the group consisting of

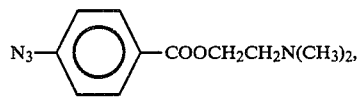

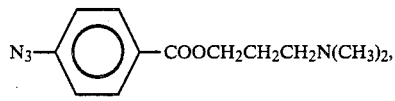

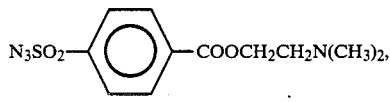

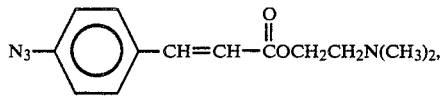

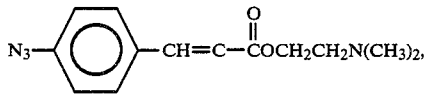

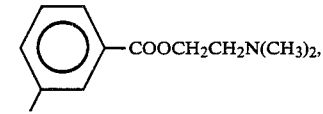

and

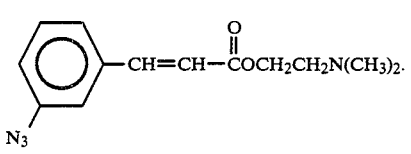

11. A composition according to claim 2, wherein the component (C) is at least one compound selected from the group consisting of triethylene glycol, tetraethylene glycol, glycerin, and tetraethylene glycol dimethyl ether.

12. A composition according to claim 2, wherein the poly(amic acid) has a repeating unit of the formula:

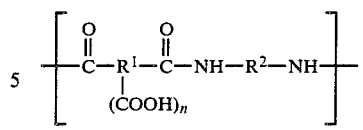

wherein $R^1$ is 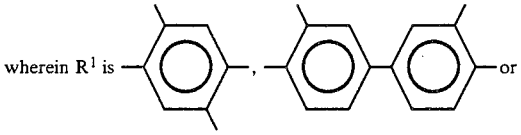 or

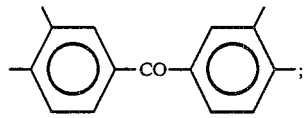;

$R^2$ is 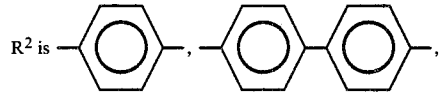,

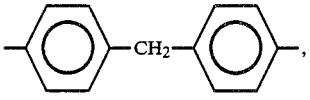,

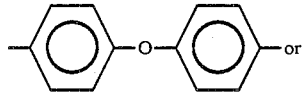,

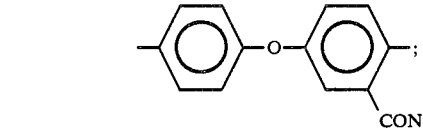;

and n is an integer of 1 or 2.

13. A composition according to claim 2, wherein the bisazide is at least one compound selected from the group consisting of

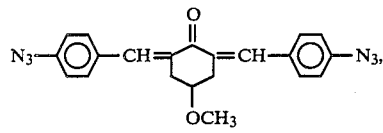

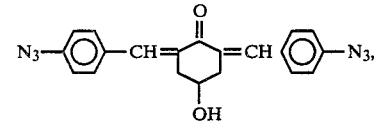

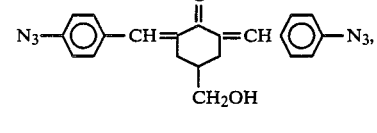

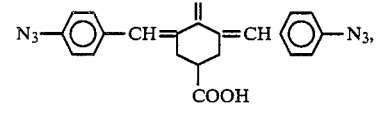

-continued
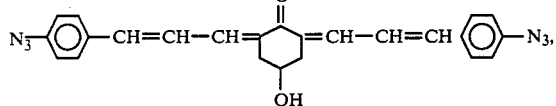
and
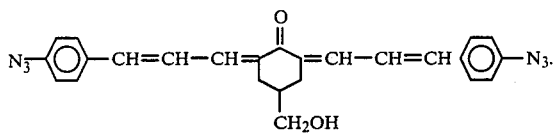
14. A composition according to claim 2, wherein the amine is at least one member selected from the group consisting of
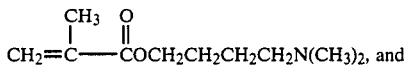
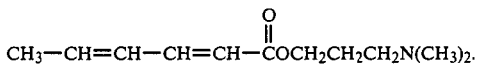
* * * * *